United States Patent
Johansen et al.

(10) Patent No.: US 8,406,437 B2
(45) Date of Patent: Mar. 26, 2013

(54) MINIATURE MICROPHONE ASSEMBLY WITH SOLDER SEALING RING

(75) Inventors: Leif Steen Johansen, Brønshøj (DK); Per F. Høvesten, Ballerup (DK); Gino Rocca, Copenhagen V (DK)

(73) Assignee: Epcos Pte Ltd, Singapore (SG)

( * ) Notice: Subject to any disclaimer, the term of this patent is extended or adjusted under 35 U.S.C. 154(b) by 640 days.

(21) Appl. No.: 12/389,011

(22) Filed: Feb. 19, 2009

(65) Prior Publication Data

US 2009/0214061 A1    Aug. 27, 2009

Related U.S. Application Data

(60) Provisional application No. 61/066,747, filed on Feb. 22, 2008.

(51) Int. Cl.
*H04R 25/00* (2006.01)
(52) U.S. Cl. .................. 381/174; 381/175; 381/369
(58) Field of Classification Search .................. 381/173, 381/174, 175, 181, 191, 356, 358, 361, 369
See application file for complete search history.

(56) References Cited

U.S. PATENT DOCUMENTS

| | | |
|---|---|---|
| 6,522,762 B1 | 2/2003 | Mullenborn et al. |
| 6,853,067 B1 | 2/2005 | Cohn et al. |
| 7,447,323 B2 * | 11/2008 | Mullenborn et al. ......... 381/174 |
| 2005/0105749 A1 | 5/2005 | Niederdrank et al. |
| 2005/0167854 A1 | 8/2005 | Tikka et al. |
| 2005/0189635 A1 | 9/2005 | Humpston et al. |

FOREIGN PATENT DOCUMENTS

| | | |
|---|---|---|
| CN | 2817273 | 9/2006 |
| WO | WO 86/06918 | 11/1986 |
| WO | WO 2005/055406 A1 | 6/2005 |
| WO | WO 2007129788 A1 | 11/2007 |
| WO | WO 2008062036 A2 | 5/2008 |

OTHER PUBLICATIONS

European Search Report corresponding to co-pending European Patent Application Serial No. 09153067.5, European Patent Office, dated Jun. 25, 2009, 7 pages.
State Intellectual Property Office of People's Republic of China, Search Report, Jan. 21, 2013, 2 pages.

* cited by examiner

*Primary Examiner* — Hoai V Pham
(74) *Attorney, Agent, or Firm* — Nixon Peabody LLP

(57) ABSTRACT

The present invention relates to a miniature microphone assembly comprising a capacitive microphone transducer comprising a microphone electrical contact or terminal, a microphone carrier comprising a carrier electrical contact or terminal formed on a first surface thereof, and an integrated circuit die comprising a die electrical terminal operatively coupled to signal amplification or signal conditioning circuitry of the integrated circuit die. The first surface of the microphone carrier comprises a first electrically conductive path surrounding the carrier electrical contact or terminal.

18 Claims, 2 Drawing Sheets

MINIATURE MICROPHONE ASSEMBLY WITH SOLDER SEALING RING

CROSS REFERENCE TO RELATED APPLICATIONS

This application is related to and claims priority to U.S. Provisional Patent Application Ser. No. 61/066,747 filed Feb. 22, 2008, titled "Miniature Microphone Assembly With Solder Sealing Ring" which is incorporated herein in its entirety.

FIELD OF THE INVENTION

The present invention relates to a miniature microphone assembly comprising a microphone carrier with an electrically conductive and substantially closed loop sealing ring disposed in-between said microphone carrier and an integrated circuit die to improve electrical insulation of one or more electrical contacts or terminals, such as high-impedance input pads of a microphone preamplifier, surrounded by said electrically conductive sealing ring.

BACKGROUND OF THE INVENTION

Miniature microphone assemblies regularly comprise a capacitive microphone transducer electrically coupled to an integrated circuit die that comprises suitable signal amplification and conditioning circuitry. The signal amplification and conditioning circuitry may comprise a low-noise preamplifier or buffer, frequency selective filters, a DC bias voltage generator etc., adapted to amplify/buffer, filter or perform other forms of signal conditioning to weak signals generated by the microphone transducer in response to impinging sound. The integrated circuit die may comprise a die electrical terminal, for example, a signal input signal terminal or a DC bias voltage terminal, electrically coupled to the capacitive microphone transducer. It is highly desirable and advantageous to provide extremely high input impedance at this die electrical terminal to, for example, optimize the noise properties of the miniature microphone assembly. An extremely high input impedance at the signal input terminal ensures that loading of the capacitive microphone transducer is minimized so as to prevent attenuation of weak audio signals generated by capacitive microphone transducer. A capacitive microphone transducer, suitable for use in miniature microphone assemblies, is usually a device with a very high generator impedance, for example, an impedance corresponding to a capacitor with a value between 0.5 pF and 10 pF.

Accordingly, this signal input terminal of the integrated circuit die is customary designed to present an input impedance higher than 100 GΩ, such as higher than 1 TΩ ($10^{12}$Ω) or even several TΩ. The input impedance is often determined by an independent bias network on the integrated circuit die, for example, a pair of reverse biased diodes, in combination with the previously-mentioned amplification and conditioning circuitry operatively coupled to the signal input terminal or pad.

However, experimental work conducted by the present inventors has demonstrated that it is very difficult to maintain this extremely high input impedance when the assembled miniature microphone is exposed to realistic environmental conditions for example moisture, cyclic heat and/or exposure to polluting agents. Under such adverse conditions, the input impedance of the integrated circuit can be significantly degraded by a formation or absorption of a thin electrically conducting layer of moisture or water on those surfaces of the microphone carrier and/or the integrated circuit die on which the carrier electrical contact and the die electrical terminal are arranged. The formation or absorption of the thin electrically conducting layer of moisture may be caused by condensation or constant high humidity. The effect is the formation of parallel resistive path, or current leakage path, between the signal input terminal or the carrier electrical contact and another electrical contact of the carrier and/or integrated circuit die—for example a ground contact or a DC supply contact. This causes a detrimental reduction of the input impedance at the signal input terminal from the desired range above 100 GΩ down to a range below a few GΩ or even down to the MΩ range. The reduced input impedance causes a significant increase in the noise level of the miniature microphone assembly.

According to the present invention, the above-mentioned problem is solved by encapsulating electrical terminals of the microphone carrier and the integrated circuit die in a cavity.

Miniature microphone assemblies in accordance with the present invention are well-suited for application in a diverse range of portable communication devices such as cellular or mobile phones, hearing aids, PDAs, game consoles, portable computers etc.

SUMMARY OF THE INVENTION

According to a first aspect of the invention, there is provided a miniature microphone assembly comprising a capacitive microphone transducer comprising a microphone electrical contact or terminal, a microphone carrier comprising a carrier electrical terminal formed on a first surface thereof, and an integrated circuit die having a first surface comprising a die electrical terminal operatively coupled to signal amplification or signal conditioning circuitry of the integrated circuit die. A first electrically conductive path may be disposed on the first surface of the integrated circuit die. The first electrically conductive path forms a substantially closed loop surrounding the die electrical terminal. Alternatively, the first surface of the integrated circuit die may comprise a plurality of die electrical terminals and a peripherally arranged first electrically conductive path surrounding the plurality of die electrical terminals.

A second electrically conductive path may be disposed on the first surface of the microphone carrier. The second electrically conductive path forms a substantially closed loop surrounding the carrier electrical terminal. The second electrically conductive path may have essentially the same shape and dimensions as the first electrically conductive path. The electrically conductive paths may in principle take any shape, such as circular, rectangular, quadratic etc. However, the shape of the electrically conductive paths preferably matches the periphery of the integrated circuit die.

The first and second electrically conductive paths may be mechanically attached and electrically interconnected to each other by an attachment agent. The attachment agent may comprise solder or a glue, such as an electrically conductive glue. Also, various bonding techniques may be applied in order to attach the first and second electrically conductive paths to each other. When attached, the first and second electrically conductive paths form a sealing ring disposed in-between the microphone carrier and the integrated circuit die. The sealing ring disposed in-between the microphone carrier and the integrated circuit die may be electrically connected to ground.

A number of through-going openings or apertures may be provided in the substantially closed loops formed by the first and second electrically conductive paths. Alternatively or in addition, a number of through-going openings or apertures may be provided in the attachment agent. Each through-going opening or aperture may have a width between 50-300 µm in a circumferential direction of the closed loop. The number of through-going openings or apertures may be between 1 and 10. The dimensions of the openings or apertures should be sufficient to ventilate the encapsulated region between the integrated circuit die and the microphone carrier when the integrated circuit die is attached thereto. On the other hand, the dimensions of the openings or apertures should be small enough to prevent liquid, such as water, from entering the encapsulated region. Openings or apertures in the attachment agent is of particular relevance when the attachment agent is solder in that the openings or apertures may be formed during a soldering reflow process of the assembly.

In case solder is used as an attachment agent, a solder sealing ring disposed in-between of the integrated circuit die and the microphone carrier may be formed during a reflow process of the assembly. During said reflow process of the microphone assembly, the reflow chamber is purged with nitrogen and the assembly is heated to above 300° C. As the microphone assembly cools down, the solder solidifies and the dry air/nitrogen is encapsulated in the small cavity established in-between the integrated circuit die and the microphone carrier. As a result, the solder bumps inside the cavity are no longer exposed to a changing environment conditions whereby electrical problems caused by an impedance drop is avoided.

The capacitive microphone transducer may comprise a condenser element or electret element such as a microelectromechanical (MEMS) condenser element. The air gap height of the microphone transducer is preferably within the range 15-50 µm for non-MEMS microphones such as traditional miniature ECMs for hearing instrument or telecom applications. These ECMs are based on an electret microphone transducer which includes an electrically pre-charged layer deposited on a diaphragm element or a back-plate element. The air gap height for MEMS based microphone transducers is preferably selected within the range 1-10 µm.

The microphone carrier may comprise first and second carrier electrical contacts separated by a distance of less than 1000 µm, such as less than 500 µm, or less than 250 µm. The first and second carrier electrical contacts comprise a first contact electrically connected to the die electrical terminal of the integrated circuit die and a second contact electrically connected to a ground line or DC voltage supply line. The small separation between carrier electrical contacts is particularly useful for so-called Chip Scale Packaging (CSP) embodiments of the present miniature microphone assembly. In a CSP package, the capacitive microphone transducer and integrated circuit die are attached to, and electrically connected to, the microphone carrier. Electrical terminals of capacitive microphone transducer and integrated circuit die are electrically coupled by electrical traces formed on the first surface of the microphone carrier. This formation of electrical interconnections may also be utilised in traditional microphone packages where the capacitive microphone transducer and integrated circuit die are positioned adjacent to each other with respective electrical terminals wire-bonded down to the first and second carrier electrical contacts, respectively on the underlying microphone carrier for example a multi-layered printed circuit board. However, for a CSP microphone assembly, the capacitive microphone transducer is located above the microphone carrier with the microphone electrical contact aligned with, and attached to, the first carrier electrical contact. The integrated circuit die is positioned adjacent to capacitive microphone transducer and having the die electrical terminal aligned with, and attached to, the second carrier electrical contact. Naturally, each of the microphone carrier and integrated circuit die may comprise additional, respective, electrical contacts that each are aligned in the same manner to corresponding additional carrier electrical contacts.

The first and second carrier electrical contacts may have a DC voltage difference larger than 0.5 Volt, or larger than 1.5 Volt or 1.8 Volt, in an operational state of the miniature microphone assembly. If one of the first and second carrier electrical contacts is used for supplying DC bias voltage to the capacitive microphone transducer, this electrical contact may have a DC voltage between 5 and 20 Volts relative to the other carrier electrical contact in an operational state of the miniature microphone assembly.

In an embodiment of the invention, one of the electrical contacts disposed on the surface of the microphone carrier comprises an electrically conductive sealing ring disposed in-between the capacitive microphone transducer and the microphone carrier. The sealing ring is used to acoustically seal a microphone back chamber formed in the microphone carrier and extending below a back plate member of the capacitive microphone transducer.

The microphone carrier may comprise various types of substrate material. The substrate material may be selected from the group of printed circuit board, ceramics such as LTCC or HTCC, doped or undoped silicon, silicon nitride, silicon oxide.

For miniature microphone assemblies, a capacitance of the capacitive microphone transducer is preferably less than 20 pF, such as less than 10 pF or less than 5 pF, such as less than 2 pF.

The capacitive microphone transducer may comprise a diaphragm and a back-plate separated by a narrow air gap wherein first and second electrical contacts or terminals are electrically coupled to the diaphragm and back-plate, respectively. As previously mentioned, one of the electrical contacts may be formed as an annular electrically conductive sealing ring mating to a corresponding electrical terminal placed on the first surface of the microphone carrier.

In an embodiment of the invention, the miniature microphone assembly is adapted for SMT compatible manufacturing techniques. The microphone carrier comprises a second and substantially plane surface arranged oppositely to the first surface and the second surface comprising a plurality of electrical contacts to allow surface mounting attachment of the miniature microphone assembly to an external circuit board. The plurality of electrical contacts may comprise a power supply pad, a digital or analogue output signal pad, a ground pad, clock signal input pad etc.

In a second aspect, the present invention relates to a portable communication device comprising a miniature microphone assembly according to the first aspect of the present invention. The portable communication device is selected from the group consisting of mobile phones, head-sets, in-ear monitors, hearing prostheses or aids, game consoles, portable computers, and any combination thereof.

BRIEF DESCRIPTION OF THE DRAWINGS

The present invention will now be explained in greater details with reference to the accompanying figures, wherein.

Figure 1:
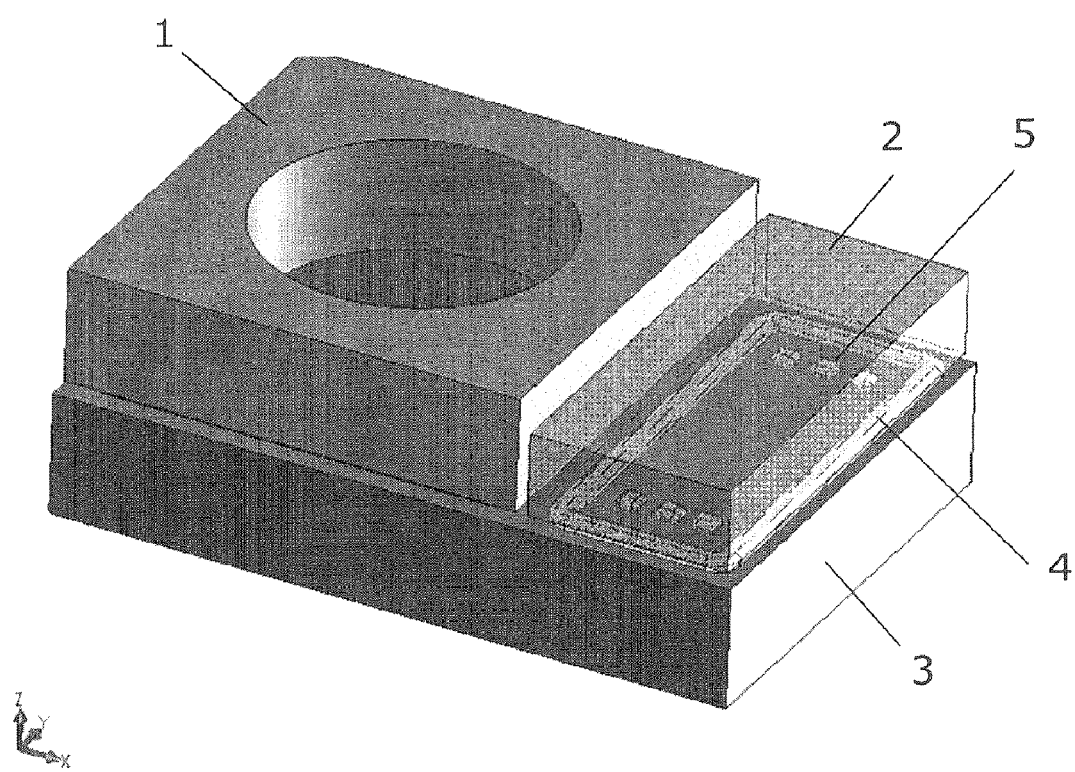
FIG. 1 shows an assembled digital microphone assembly.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its broadest aspect the present invention relates to a microphone assembly, such as a miniature microphone assembly, comprising a capacitive microphone transducer, a microphone carrier and an integrated circuit die. Electrical contact terminals of the circuit die are sealed by an electrically conductive sealing ring disposed in-between the integrated circuit die and the microphone carrier to which the integrated circuit die is mechanically attached via the sealing ring. The electrically conductive sealing ring may be formed using a variety of processes, such as for example soldering, gluing or bonding processes. However, other processes may also be applicable.

FIG. 1 illustrate a silicon-based microphone assembly that comprises a MEMS capacitive transducer die 1 and an integrated circuit die 2, ASIC, mounted adjacent to each other and both mechanically attached to an upper surface of a microphone carrier 3 by flip-chip mounting. The MEMS capacitive transducer die and the integrated circuit die are electrically coupled via respective sets of die electrical contacts and transducer electrical contacts to corresponding sets of aligned carrier electrical contacts. The microphone assembly accordingly forms a CSP packaged device. The outer dimensions of the CSP packaged miniature microphone assembly may be about or less than 1.6×2.4×0.9 mm (W×L×H). An inherent consequence of these small dimensions is closely spaced electrical pads or terminals on the microphone carrier which makes the microphone assembly vulnerable to parasitic current leakage paths—for example created between a ground electrical terminal and a high impedance input (or output) terminal. The current leakage path may be created by formation or absorption of a thin electrically conducting layer of moisture, water or other contamination agent deposited on the surface of the microphone carrier in-between the illustrated ground terminal and input signal terminal. Depending on the electrical characteristics of relevant circuitry of the integrated circuit die and resistive properties of the current leakage path, the MEMS based microphone assembly may cease to operate within its electrical specifications or even worse completely cease operation.

The MEMS based microphone assembly illustrated in FIG. 1 further comprises a solder sealing ring 4 surrounding and encapsulating corresponding sets of aligned carrier electrical contacts and die electrical contacts 5.

Figure 2:
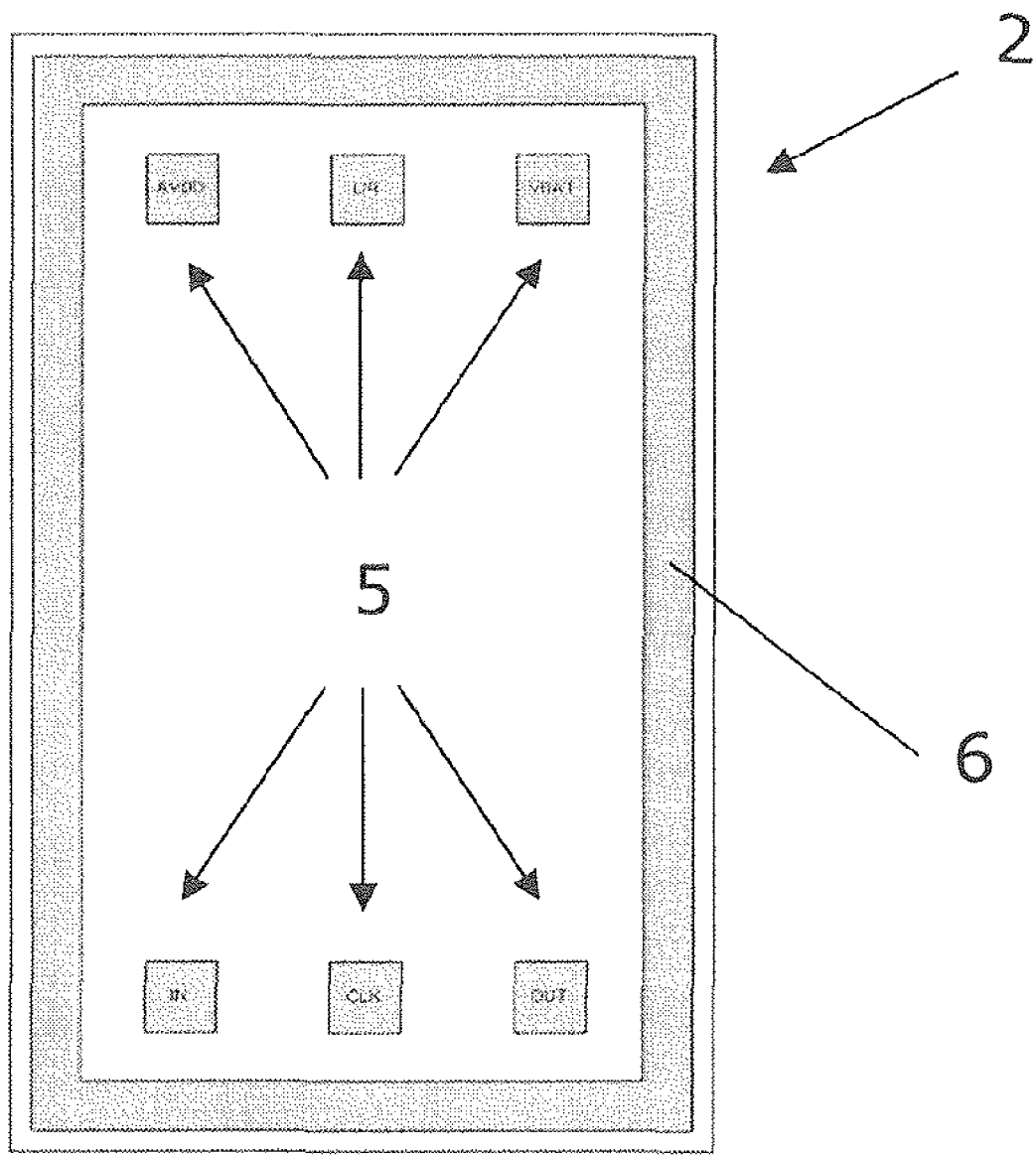
FIG. 2 illustrates an ASIC having six contact pads and a sealing ring surrounding the contacts pads.

The encapsulating solder sealing ring is established by providing an electrically conductive path 6 on a bottom surface of the integrated circuit die. As depicted in FIG. 2 the electrically conductive path 6 surrounds the die electrical contacts 5. A corresponding electrically conductive path is provided on the microphone carrier 3.

During reflow of the microphone assembly, the reflow chamber is purged with nitrogen and the assembly is heated to above 300° C. As the microphone assembly cools down the solder solidifies below 300° C. and the dry air/nitrogen is encapsulated in the small cavity established between the integrated circuit die and the microphone carrier. As a result, the solder bumps inside the cavity are no longer exposed to a changing environment conditions. Condensation inside the cavity is not possible due to the dry air/nitrogen mixture present in the cavity.

In addition to the electrical improvement, the provided solder sealing ring will increase shear forces considerably. Thus, extra solder bumps are no longer required. Furthermore, a vacuum is established during cooling down. This ensures extra compression on the contacts in normal use which most likely increases reliability during drop test and thermal cycling tests.

With a solidification temperature of the solder close to 300° C. normal usage will not result in an over pressure in the cavity below the integrated circuit die. Thus, there is no risk that the integrated circuit die "pops off" when heated during assembly reflow.

The invention claimed is:

1. A miniature microphone assembly, comprising:
   a capacitive microphone transducer comprising a microphone electrical contact or terminal;
   a microphone carrier comprising a carrier electrical terminal formed on a first surface thereof; and
   an integrated circuit die having a first surface comprising a die electrical terminal operatively coupled to signal amplification or signal conditioning circuitry of the integrated circuit die, and
      wherein a first electrically conductive path is disposed on the first surface of the integrated circuit die, said first electrically conductive path forming a substantially closed loop surrounding the die electrical terminal.

2. A miniature microphone assembly according to claim 1, wherein a second electrically conductive path is disposed on the first surface of the microphone carrier, said second electrically conductive path forming a substantially closed loop surrounding the carrier electrical terminal.

3. A miniature microphone assembly according to claim 2, wherein the second electrically conductive path has essentially the same shape and dimensions as the first electrically conductive path.

4. A miniature microphone assembly according to claim 2, wherein the first and second electrically conductive paths are mechanically attached and electrically interconnected to each other by an attachment agent.

5. A miniature microphone assembly according to claim 4, wherein the attachment agent comprises solder or glue.

6. A miniature microphone assembly according to claim 4, wherein the first and second electrically conductive paths are disposed in-between the microphone carrier and the integrated circuit die.

7. A miniature microphone assembly according to claim 4, wherein a number of through-going openings are provided in the substantially closed loops formed by the first and second electrically conductive paths, each through-going opening having a width between 50-300 μm in a circumferential direction of the closed loop.

8. A miniature microphone assembly according to claim 7, wherein the number of through-going openings is between 1 and 10.

9. A miniature microphone assembly according to claim 4 wherein a number of through-going openings are provided in the attachment agent, each through-going opening having a width between 50-300 μm in a circumferential direction of the closed loop.

10. A miniature microphone assembly according to claim 1, wherein the capacitive microphone transducer comprises a condenser element or electret element such as a microelectromechanical (MEMS) condenser element.

11. A miniature microphone assembly according to claim 1, wherein the microphone carrier comprises substrate material selected from the group of a printed circuit board, ceramics, and silicon.

12. A miniature microphone assembly according claim 1, wherein a capacitance of the capacitive microphone transducer is less than 20 pF, such as less than 10 pF or less than 5 pF, such as less than 2 pF.

13. A miniature microphone assembly according to claim 1, wherein the capacitive microphone transducer comprises diaphragm and back-plate members and first and second electrical contacts or terminals electrically coupled to the diaphragm and back-plate members, respectively.

14. A miniature microphone assembly according to claim 1, wherein the capacitive microphone transducer and integrated circuit die are attached to, and electrically connected to, the microphone carrier and electrically interconnected by electrical traces formed on the first surface or an underlying layer of the microphone carrier.

15. A miniature microphone assembly according to claim 14, wherein the capacitive microphone transducer is located above the microphone carrier with the microphone electrical contact aligned with a first carrier electrical contact and, optionally, the integrated circuit die is positioned adjacent to the capacitive microphone transducer and having the die electrical terminal aligned to a second carrier electrical contact.

16. A miniature microphone assembly according to claim 1, wherein the first surface of the integrated circuit die comprises a plurality of die electrical terminals and a peripherally arranged first electrically conductive path surrounding the plurality of die electrical terminals.

17. A miniature microphone assembly according to claim 1, wherein the microphone carrier further comprises:
 a second and substantially plane surface arranged opposite to the first surface, and
 the second surface comprising a plurality of electrical contacts to allow surface mounting attachment of the condenser microphone assembly to an external circuit board.

18. A miniature microphone assembly according to claim 1, wherein the assembly is part of a portable communication device being selected from the group consisting of mobile phones, head-sets, in-ear monitors, hearing prostheses or hearing aids, game consoles, and portable computers, and any combination thereof.

* * * * *

UNITED STATES PATENT AND TRADEMARK OFFICE
CERTIFICATE OF CORRECTION

| | |
|---|---|
| PATENT NO. | : 8,406,437 B2 |
| APPLICATION NO. | : 12/389011 |
| DATED | : March 26, 2013 |
| INVENTOR(S) | : Johansen et al. |

Page 1 of 1

It is certified that error appears in the above-identified patent and that said Letters Patent is hereby corrected as shown below:

In the Claims

In column 6, line 29 (claim 1, line 13), after "surrounding" please insert -- only --.

Signed and Sealed this
Thirty-first Day of December, 2013

Margaret A. Focarino
*Commissioner for Patents of the United States Patent and Trademark Office*